United States Patent [19]
Leipert

[11] Patent Number: 4,907,292
[45] Date of Patent: Mar. 6, 1990

[54] TELEVISION TUNER

[75] Inventor: Emil Leipert, Neustadt, Fed. Rep. of Germany

[73] Assignee: Telefunken Electronic GmbH, Heilbronn, Fed. Rep. of Germany

[21] Appl. No.: 103,141

[22] Filed: Oct. 1, 1987

[30] Foreign Application Priority Data

Oct. 1, 1986 [DE] Fed. Rep. of Germany ....... 3633383

[51] Int. Cl.$^4$ .......................... H03J 5/00; H04B 1/18; H04N 5/44
[52] U.S. Cl. .................................. 455/280; 455/191; 455/188; 455/180; 358/191.1
[58] Field of Search ............... 455/160, 280, 191, 187, 455/188, 176, 179, 180; 358/191.1, 192.1, 193.1, 195.1, 188

[56] References Cited

U.S. PATENT DOCUMENTS

| | | | |
|---|---|---|---|
| 3,903,487 | 9/1975 | Maier | 455/191 X |
| 4,215,372 | 7/1980 | Suzuki | 358/191.1 X |
| 4,291,290 | 9/1981 | Ijichi et al. | 455/191 X |
| 4,555,808 | 11/1985 | Fujimoto | 455/180 |
| 4,598,423 | 7/1986 | Hettiger | 455/191 |
| 4,612,571 | 9/1986 | Moon | 455/191 X |
| 4,736,456 | 4/1988 | Maier | 455/191 X |

FOREIGN PATENT DOCUMENTS 3538921 5/1987 Fed. Rep. of Germany .

Primary Examiner—Robert L. Griffin
Assistant Examiner—Ralph E. Smith
Attorney, Agent, or Firm—Spencer & Frank

[57] ABSTRACT

A television tuner for three frequency ranges (I, II, III) comprises a common antenna connection (4) for corresponding input filter circuits. The input filter circuits (1, 2, 3) of the two higher frequency ranges can be connected to and disconnected from the antenna connection by means of switches (11, 12). The switches (11, 12) are each located between the antenna connection (4) and the associated input filter circuit (2, 3). To improve matching of the input filter circuit (3) and to simplify the configuration of the circuit, the antenna connection (4) is arranged in the proximity of an input filter circuit (1, 2) of the two lower-frequency frequency ranges (I, II). In addition, the switch (12) for the highest frequency range (III) is connected to the end of a coupling conductor (5) which is spaced closest to the antenna connection (4). Both ends of the coupling conductor (5') are connected to ground by means of a respective capacitor (5a, 5b) and the coupling conductor is coupled with an input circuit conductor (6') of the input filter circuit (3) of the highest frequency range (III).

15 Claims, 1 Drawing Sheet

U.S. Patent
Mar. 6, 1990
4,907,292
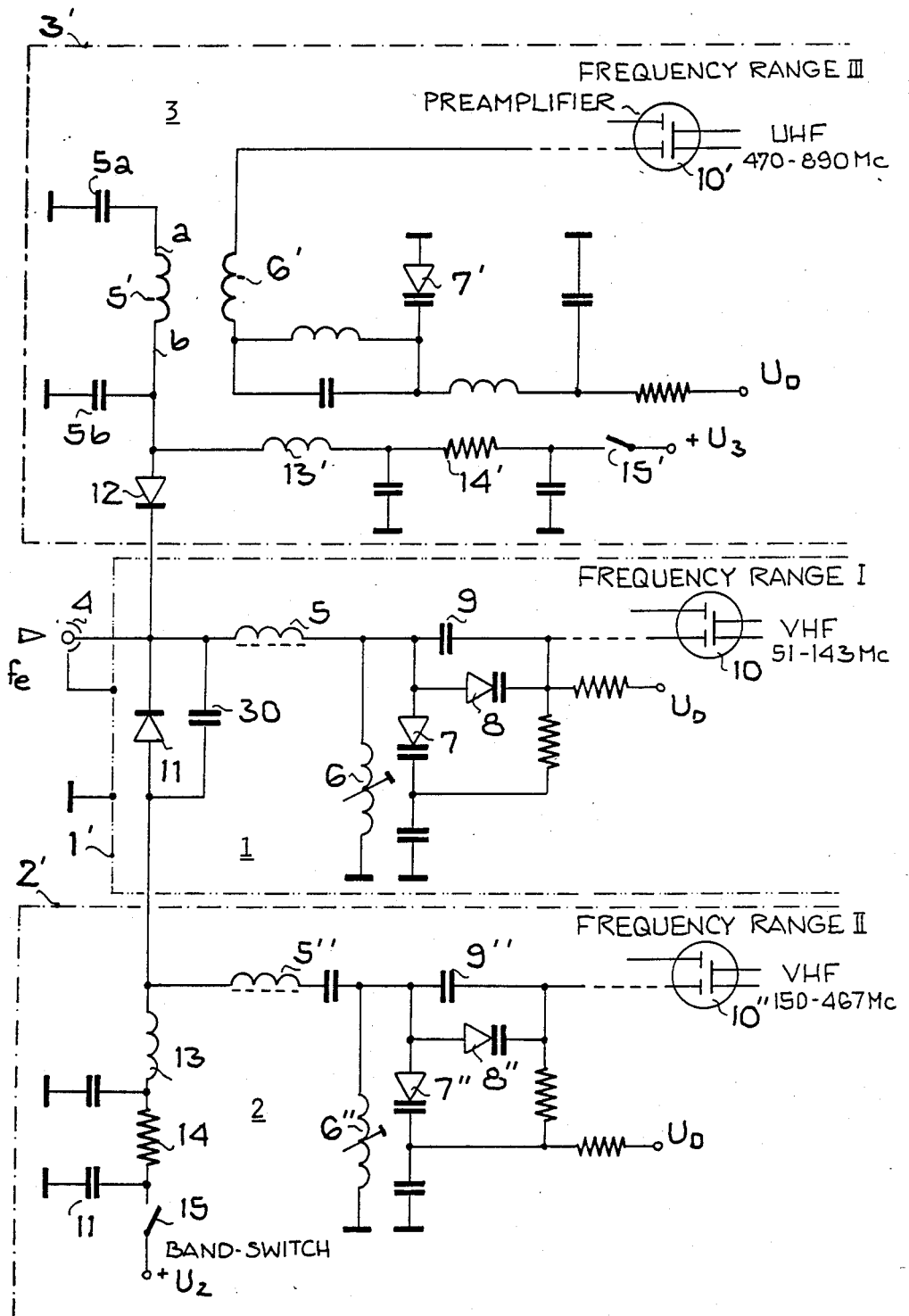

4,907,292

TELEVISION TUNER

BACKGROUND OF THE INVENTION

The invention relates to a television tuner for three frequency ranges with a common antenna connection to which three corresponding input filter circuits are connected, with at least the input filter circuits for the two higher frequency ranges being connectable and disconnectable by means of switches which are connected between the antenna connection and the associated input filter circuit, in each case.

In the television tuner according to Federal Republic of Germany Offenlegungsschrift (unexamined Patent Application) No. 3,538,921.4), published May 14th, 1987, a common antenna connection is provided for three different frequency ranges. The switches are connected between the respective antenna connection and the associated input filter circuit. The input filter circuits are accommodated within a housing in compartments which are separated from one another with respect to high frequencies. The antenna connection is located outside of the space defined by the input filter circuits.

SUMMARY OF THE INVENTION

It is the object of the invention to take measures in a television tuner according to the above patent identified application which enable optimum matching and coupling of the antenna connection to the input filter circuit of the highest frequency range if the antenna connection is arranged in the region of the compartment of the lower-frequency input filter circuit.

The above object is accomplished according to the invention by the antenna connection being located in the proximity of an input filter circuit of one of the two lower frequency ranges, by the switch for the highest frequency range being connected to the end of a coupling conductor which is located closest to the antenna connection, by both ends of the coupling conductor being connected to ground by means of a respective capacitor, and by the coupling conductor being coupled with an input circuit conductor of the input filter circuit of the highest frequency range.

In a circuit configuration according to the invention, short coupling paths are obtained between the antenna connection remote from the input filter circuit for the highest frequency range and the coupling conductor of the input filter circuit for the highest frequency range. The capacitors connected to both ends of the coupling conductor can then simultaneously serve as supports for the coupling conductor as these capacitors can be firmly soldered to the wall of the associated chamber.

The capacitors then have such dimensions that optimum matching with respect to the electromagnetic and/or capacitive coupling with the input circuit conductor of the associated input filter circuit is achieved.

BRIEF DESCRIPTION OF THE DRAWING

The FIGURE is a schematic circuit diagram of an embodiment of a tuner according to the invention.

DETAILED DESCRIPTION OF THE PREFERRED EMBODIMENT

In a television tuner for all channels between the frequencies of 51 to 890 MHz, this entire frequency band is divided into three frequency ranges, i.e., frequency range I from 51 to 143 MHz for receiving channels 2 to S6, frequency range II from 150 to 467 MHz for receiving channels S7 to S41 and frequency range III from 470 to 890 MHz for channels 21 to C83. Frequency ranges I to III each have their own associated input filter circuits 1, 2, 3 which are fed by a common antenna connection 4. The input filter circuit (1) of the lowest frequency range I is directly connected to antenna connection (4) by means of an inductive coupling coil (5) in the form of a coupling conductor and, on the other hand, to an inductive input circuit coil (6) connected at one end to ground and to further filter elements, particularly to a variable capacitance tuning diode (7) and a likewise variable capacitance coupling diode (8). Coupling diode (8) is connected in parallel with a coupling capacitor (9) in the signal circuit of a preamplifier circuit including a field-effect transistor (10).

On the other hand, the signal path from the antenna connection (4) to each of the inputs of the input filter circuits (2 and 3) for the upper frequency ranges (II and III) includes a switch (11 and 12, respectively) which, in both cases, is configured as a switching diode. Switching diodes (11, 12) are connected with the same polarity, in the present case with their cathodes, to the antenna connection (4), and the junction point of diodes (11, 12) is dc-connected to the coupling coil (5) of the lowest frequency input filter circuit (1) so as to form a dc-path through the input circuit coil (6) whose one end is connected to ground. By means of a respective decoupling coil (13) or 13' and a respective current-limiting resistor (14) or 14' as well as a respective range selector (15) or 15', the connections of switching diodes (11, 12) facing away from the antenna connection (4) can be selectively connected to and disconnected from a range switching voltage source (U2) for input filter circuit (2) and a range switching voltage source (U3) in input filter circuit (3). The second pole of range switching voltage sources (U2 and U3) is connected to ground.

The antenna connection (4) is located in the proximity of an input filter circuit for one of the lower-frequency frequency ranges (I, II), in the present case the input filter circuit for the lowest frequency range (I). The switch (12) for the highest frequency range (III) leads directly to the end (b) of the coupling conductor 5' in input filter circuit (3) spaced closest to the antenna connection (4). This results in an optimally short connection which can be laid with sufficient mechanical stability as far as the coupling conductor 5'. Each end of coupling conductor 5' is soldered to a capacitor (5a, 5b), preferably a disc capacitor which is soldered to the wall of the chamber (3') accommodating input filter circuit (3) for the highest frequency range (III). The other input filter circuits (1, 2) are also accommodated in individual chambers (1', 2') formed in a common housing. The switch (12) is located in the chamber (3') for the highest frequency range. The capacitors (5a, 5b) are dimensioned so as to provide for optimum matching with the antenna connection and coupling of the correct frequency range to the input circuit conductor 6' of this input filter circuit (3).

It is also possible to connect in parallel with switch (11) for the medium frequency range (II) a matching capacitor (30) which, in turn, is dimensioned so that spurious resonances do not occur in the input filter circuit for the medium frequency range when the highest frequency range is received, but matching of the input filter circuit (3) with the antenna connection is promoted.

Moreover, when frequencies are received in one frequency range, the field-effect transistors 10, 10', 10'' of the other preamplifier stages are electrically switched off.

If the range selectors (15) and 15' are open, in which case the preamplifier circuits 10, 11 and 10' of the input band filter circuits (2, 3) are also without current, no current flows through the switching diodes (11, 12), i.e., the switching diodes (11, 12) are blocked. Their junction capacitance is then so low that the reactive inductive or capacitive influences from the input filter circuits (2, 3) are cut off from the antenna connection (4). Only the input filter circuit (1) and its associated preamplifier circuit (10), if switched on, remain effective. With no capacitive or inductive loads from the other input filter circuits (2, 3), the full tuning range of the tuning diode (7) can be utilized and, particularly towards higher frequencies, the influence of the relatively high input capacitance of field-effect transistor (10) is also reduced by way of the then decreased junction capacitance of coupling diode (8). The tuning range is thereby enlarged, particularly towards the end of the higher frequency range. Input filter circuit (2) for the medium frequency range (II) behaves analogously.

If the preamplifier circuit of frequency range (I) is switched off and, for example, range selector (15) in input filter circuit (2) is closed instead, current flows through switching diode (11) which thereby becomes conductive for high frequency currents. This causes the input signals to travel from the antenna connection (4) to the input filter circuit (2) which is of essentially the same design as input filter circuit (1), i.e., it contains correspondingly connected components 5'', 6'', 7'', 8'' and 9''. Thus corresponding input frequencies can be selected when the preamplifier circuit 10'' for frequency range (II) is switched on. Since the input filter circuit (1) for the lowest frequency range is configured correspondingly, interfering resonances do not occur in the higher frequency range (II). The same is also applicable if range switching voltage source (U2) is switched off and range switching voltage source (U3) is closed by means of the associated switch 15' in input filter circuit (3).

To reduce the junction capacitance of the switching diodes (11, 12), the input circuit coil (6) of the lowest-frequency input filter circuit (1) can be connected to ground by means of the parallel connection comprising a bottom-end capacitor and a first voltage divider resistor and also to a reverse voltage source by means of a second voltage divider resistor and a reverse voltage switch. During operation of the television tuner in frequency range (I), the reverse voltage switch is closed and a reverse voltage directed against the conducting direction of switching diodes (11, 12) is applied to the latter. The capacitance of the switching diodes (11, 12) is thereby further reduced and decoupling of the higher-frequency input filter circuits (2, 3) is improved.

All of the input filter circuits (1, 2, 3) are tunable to the receiving frequency to be selected and include correspondingly dimensioned input circuits composed of respective tuning coils (6, 6'' and 6') and respective tuning diodes (7, 7' and 7''). The tuning diodes (7, 7' and 7'') and, in frequency ranges I and II, also the coupling diodes (8) and 8'' are connected to a tuning voltage UD, with a change in this tuning voltage permitting a variation of the junction capacitance of diodes (7, 7'', 7', 8, 8'') and thus the resonance frequency with the associated input circuit coil (6, 6'', 6'). Toward higher receiving frequencies, the junction capacitance of diodes (7, 7'', 7', 8, 8'') is adjusted to a lower value.

Moreover, the coupling coils (5) and (5'') for the filter circuits (1) and (2) are each provided with an associated ferrite core (indicated schematically by the respective dashed lines) whose cutoff frequency lies at the upper end of the respective frequency range (I, II).

I claim:

1. In a television tuner for three frequency ranges and having a common antenna connection to which three corresponding input filter circuits, one for each of said frequency ranges, are connected, with at least the input filter circuits for the two higher of said three frequency ranges being connectable and disconnectable by means of respective switches disposed between said antenna connection and its associated input filter circuit, the improvement wherein: said antenna connection is located in the proximity of an input filter circuit of one of the two lower of said three frequency ranges; said switch for the highest of said three frequency ranges is connected to the end of a coupling conductor which is spaced closest to said antenna connection; each end of said coupling conductor is connected to ground by means of a respective capacitor; and said coupling conductor is coupled with an input circuit conductor of the input filter circuit of said highest frequency range.

2. A television tuner according to claim 1, wherein said switches at said antenna connection are connected at one end to a direct current connection and are configured as switching diodes.

3. A television tuner according to claim 2, wherein the switching diodes are connected to the antenna connection with the same polarity.

4. A television tuner according to claim 2, further comprising respective means, each including a respective decoupling coil and a respective current limiting resistor, for selectively connecting each of said switching diodes, at their respective connection facing away from said antenna connection, to a respective voltage source.

5. A television tuner according to claim 1, wherein the input filter circuit for the lowest frequency range is connected directly to the antenna connection.

6. A television tuner according to claim 1, wherein the input filter circuit for the lowest frequency range includes an inductive coupling coil which is connected at one end to the antenna connection and with the switches, and at the other end to one end of an inductive input circuit coil, whose other end is connected to ground, and to further filter elements.

7. A television tuner according to claim 6, wherein the input circuit coil of the lowest-frequency input filter circuit is connected to ground via the parallel connection of a capacitor and a first voltage divider resistor and also to a reverse voltage source via a second voltage divider resistor (18).

8. A television tuner according to claim 6, wherein: the input filter circuit for the middle range of said three frequency ranges includes a further coupling coil which is connected at one end to said antenna connection via the associated one of said switches and at its other end to one end of a respective inductive input circuit coil, whose other end is connected to ground, and to other filter elements; and said coupling coil and said further coupling coil of the two lower-frequency input filter circuits each has an associated ferrite core whose cutoff frequency lies at the upper end of the respective frequency range.

9. A television tuner according to claim 1, wherein said input filter circuits are input circuits tunable to the receiving frequency to be selected.

10. A television tuner according to claim 1, wherein said input filter circuits each precede their own respective preamplifier circuit.

11. A television tuner according to claim 1, wherein: said input filter circuits for the two lower frequency ranges are each coupled by means of a respective variable capacitor to a respective amplifier input stage; and the capacitance of each said capacitor increases with decreasing frequency.

12. A television tuner according to claim 11, wherein only the amplifier input stage following the activated input filter circuit is switched on.

13. A television tuner according to claim 1, wherein a matching capacitor optimized for said highest frequency range is connected in parallel with the respective said switch connected to the input filter circuit for the middle range of said three frequency ranges.

14. A television tuner according to claim 1, wherein: the three input filter circuits are arranged in individual chambers of a common housing; and the switch for the highest frequency range is arranged in the chamber of the associated input filter circuit.

15. A television tuner according to claim 14, wherein the switch for the middle frequency range of said three frequency ranges is arranged in the chamber for the lowest-frequency range input filter circuit.

* * * * *